United States Patent
Taguchi et al.

(10) Patent No.: US 6,469,448 B2
(45) Date of Patent: Oct. 22, 2002

(54) INDUCTIVELY COUPLED RF PLASMA SOURCE

(75) Inventors: Youji Taguchi, Susono; Tomoyasu Kondo, Gotenba, both of (JP)

(73) Assignee: Nihon Shinku Gijutsu Kabushiki Kaisha, Chigasaki (JP)

( * ) Notice: Subject to any disclaimer, the term of this patent is extended or adjusted under 35 U.S.C. 154(b) by 0 days.

(21) Appl. No.: 09/768,236

(22) Filed: Jan. 25, 2001

(65) Prior Publication Data

US 2002/0096999 A1 Jul. 25, 2002

(51) Int. Cl.[7] .................................................. H01J 7/24

(52) U.S. Cl. ............................ 315/111.21; 315/111.41; 315/111.91; 118/723 I; 219/494; 156/345

(58) Field of Search ........................ 315/111.21, 111.41, 315/111.31, 111.51, 111.71, 111.81, 111.91; 156/365; 118/723 I, 723 AN, 723 IR; 219/494

(56) References Cited

U.S. PATENT DOCUMENTS

| 5,540,824 A | * | 7/1996 | Yin et al. ............... 204/298.34 |
| 5,710,486 A | * | 1/1998 | Ye et al. .................. 315/111.21 |
| 6,016,131 A | * | 1/2000 | Sato et al. .................. 343/895 |

* cited by examiner

*Primary Examiner*—Don Wong
*Assistant Examiner*—Tuyet T. Vo
(74) *Attorney, Agent, or Firm*—Larson & Taylor, PLC

(57) ABSTRACT

The present invention provides an inductively coupled RF plasma source that can improve the nonuniformity in substrate treatment by canceling out the radial electric fields generated between a plasma and an antenna coil. The inductively coupled RF plasma source comprises a plurality of one-turn antenna coils, each having one end connected to a RF supply along a circumferential side wall of a plasma generating chamber and the other end connected to a grounding potential, arranged at intervals in the longitudinal axial direction of the plasma generating chamber. One end of each one-turn antenna coil displaced at equal angles from each other in a circumferential direction.

11 Claims, 7 Drawing Sheets

INDUCTIVELY COUPLED RF PLASMA SOURCE

BACKGROUND OF THE INVENTION

The present invention relates to an inductively coupled RF (Radio-frequency) plasma source that is used when a film is formed by sputtering, CVD (chemical vapor deposition), etc. on a surface of a substrate composed of silicon, gallium, quartz, glass, etc. that may be used for semiconductors and electronic materials, or when the substrate is etched, or a natural oxide film formed on the substrate surface or unwanted substance on the substrate is removed.

FIG. 1 shows one example of the conventional apparatus of this type, wherein a plasma generating chamber B is provided integrally and continuously with on a vacuum chamber A. A side wall around this plasma generating chamber B is composed of a material such as quartz, etc., through which electromagnetic waves are transmitted. On the outer circumference of the plasma generating chamber B is arranged a one-turn antenna coil C comprising a metal pipe or bar as shown in FIG. 2. To one end of the antenna coil C, a RF power source D is connected, with the other end grounded so that Radio-frequency (RF) power can be supplied to the antenna coil C. On the top end of the plasma generating chamber B, a top plate (or lid) E is provided.

To the vacuum chamber A, a vacuum pump F and a gas introducing mechanism G are mounted, so that the pressure inside the vacuum chamber A can be set to an optional value. To the vacuum chamber A, a loading/unloading section I is provided for taking in and out a substrate H such as a wafer of workpiece. In the vacuum chamber A, a wafer holder J for mounting the wafer H is mounted opposite to the top lid E at the top end of the plasma generating chamber B. It is structured so that RF electric power can be applied to the wafer H from a RF power source K as required.

In the apparatus of FIG. 1, a target for sputtering may be mounted to the top lid E at the top end of the plasma generating chamber B, which is made to be opposite to the wafer holder J. The top plate E may be connected to a power supply L so that direct current or RF power can be supplied.

For another example of the prior art, an apparatus is known where a multiple-turn antenna coil as shown in FIG. 3 is mounted in place of a one-turn antenna coil shown in FIG. 2.

Furthermore, in the apparatus shown in FIG. 1, a structure with an antenna coil arranged inside the plasma generating chamber is also known.

In the operation of the conventional apparatus configured in this way, the substrate H such as a wafer is prepared on the wafer holder J, gas is introduced from the gas introducing mechanism G to the vacuum chamber A, and a pressure is set to predetermined values. Then, RF electric power is applied from the RF power supply D to the antenna coil C. The RF electric field is induced by a inductive coupling in the circumferential direction in the plasma generating chamber B, thus a plasma being generated. Under this condition, applying the RF bias power to the wafer holder J accelerates the cation within the generated plasma toward the wafer direction by the bias voltage, and causes the cation to collide against the wafer, and etches the wafer surface or carries out other treatment.

In the structure using a one-turn antenna coil, it is possible to achieve matching at between 10 and 15 MHz, and the structure is simple, but as shown in FIG. 4, the capacitive coupling occurs between the plasma and the antenna coil. By this capacitive coupling, an electric field is generated that accelerates the cations in the plasma toward the antenna coil, that is, against the chamber wall. This electric field is the strongest at the RF introducing section and becomes nearly zero in the vicinity where the other end is grounded. Consequently, the plasma in the vicinity of the RF introducing section moves more toward the chamber side wall and imbalance is generated in a plasma density. As a result, the uniformity in processing across the wafer surface is impaired.

On the other hand, in the structure using a multiple-turn antenna coil, the structure becomes complex and at the same time the reactance of the antenna coil increases, and it becomes difficult to achieve matching at 13.56 MHz, which is the industrial frequency. Consequently, the frequency must be lowered, and license is separately needed for the Radio Law, which is not economical and is time-consuming.

By the way, the capacitive coupling between the antenna coil and the plasma occurs also in the multiple-turn antenna coil, but improvement measures such as installing the RF introducing section only where high capacitive coupling works due to multiple turns kept away from the chamber, or installing at places where influence is difficult to be exerted, etc. can be easily taken.

BRIEF SUMMARY OF THE INVENTION

Accordingly, it is an object of the present invention to provide an inductively coupled RF plasma source that can improve the nonuniformity in substrate processing by solving the problems associated with the conventional techniques as described above and canceling out the radial electric fields generated between the plasma and the antenna coil.

In order to achieve the above object, the inductively coupled RF plasma source according to the present invention for generating a RF plasma using the inductive coupling comprises a plurality of one-turn antenna coils, each having first end connected to a RF power supply along a circumferential side wall of a plasma generating chamber and second end connected to a grounding potential, arranged at intervals in the longitudinal axial direction of the plasma generating chamber, first end of each one-turn antenna coil being displaced at equal angles from each other in the circumferential direction.

In the present invention, each of one-turn antenna coils may be arranged along the outside or inside of the circumferential side wall of the plasma generating chamber. When each of one-turn antenna coils is arranged along the outside of the circumferential side wall of the plasma generating chamber, the circumferential side wall of the plasma generating chamber is composed of an electromagnetic wave-transmission material.

When the number of one-turn antenna coils is two, one end connected to the RF power supply of each of these two one-turn antenna coils is arranged at an angular displacement of 180° from each other in the circumferential direction of the circumferential side wall of the plasma generating chamber. In the case of three, one end connected to the RF power supply of each of these three one-turn antenna coils is arranged at an angular displacement of 120° from each other in the circumferential direction of the circumferential side wall of the plasma generating chamber. Furthermore, in the case of four, one end connected to the RF power supply of each of these four one-turn antenna coils is arranged at an angular displacement of 90° from each other in the circumferential direction of the circumferential side wall of the plasma generating chamber.

The RF power supply connected to one end of each of the one-turn antenna coils may be installed in common to all the coils or for each antenna coil.

In the inductively coupled RF plasma source according to the present invention configured as described above, the radial electric fields between the antenna coils and the plasma are equalized with respect to the apparatus center. The plasma density in the chamber is made uniform, and processing uniformity across the wafer surface can be improved.

DETAILED DESCRIPTION OF THE INVENTION

Now referring to FIG. 5 through FIG. 7 attached, the embodiment of the present invention will be described in detail thereafter.

Figure 5:
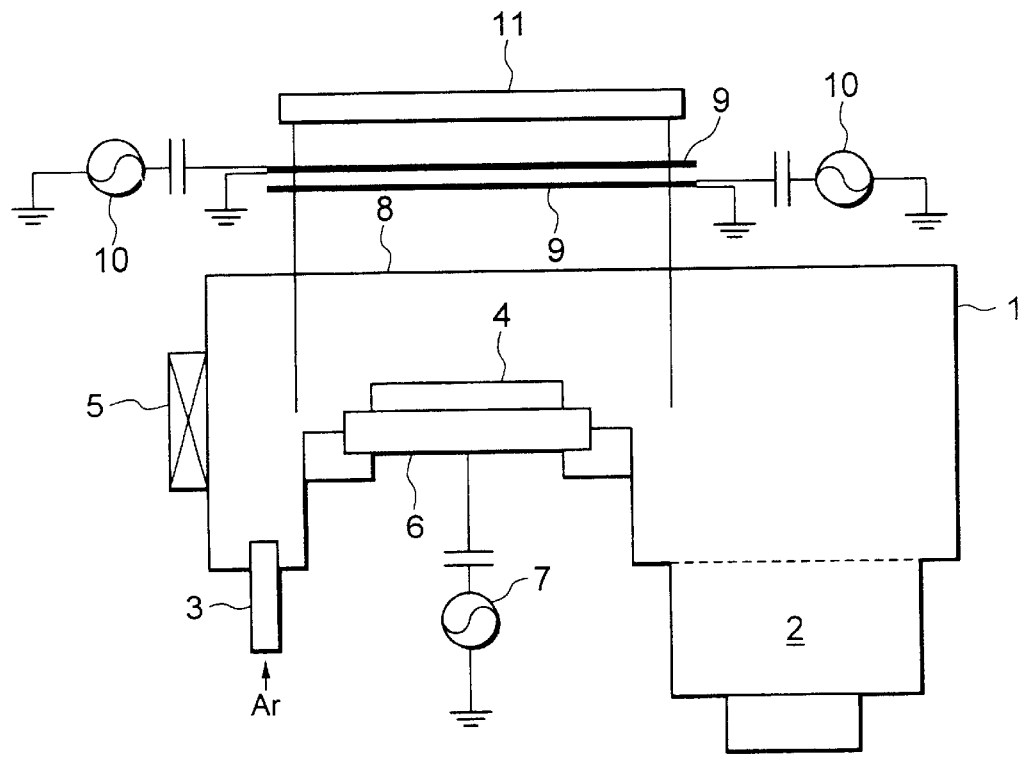
FIG. 5 is a schematic illustration showing the plasma treatment apparatus utilizing the inductively RF coupled plasma source according to the present invention.

FIG. 5 shows a plasma treatment apparatus utilizing the inductively coupled RF plasma source according to the present invention. Numeral 1 denotes a vacuum chamber of the plasma treatment apparatus, and on the vacuum chamber 1, a vacuum pump 2 and a gas introducing mechanism 3 are arranged, and pressure inside the vacuum chamber 1 is able to be set to foredetermined values. To the vacuum chamber 1, a loading/unloading section through which a substrate 4 such as wafers and other workpieces is able to be taken in and out is equipped. In addition, a wafer holder 6 to which the wafer 4 is mounted is provided in the vacuum chamber 1. This wafer holder 6 is connected to the RF power supply 7.

To the top of the vacuum chamber 1, a plasma generating chamber 8 for configuring the inductively coupled RF plasma source according to the present invention is integrally provided. The circumferential side wall of this plasma generating chamber 8 is composed of a material such as quartz, etc. through which electromagnetic waves are transmitted. On the outer circumference of the plasma generating chamber 8, two one-turn antenna coils 9 comprising metal pipes or bars for generating a plasma inside the plasma generating chamber 8 are arranged. One end of each antenna coil 9 is connected to the RF power supply 10 of 12.5 MHz to form an introducing terminal of a RF electric power, while the other end is grounded.

Figure 6:
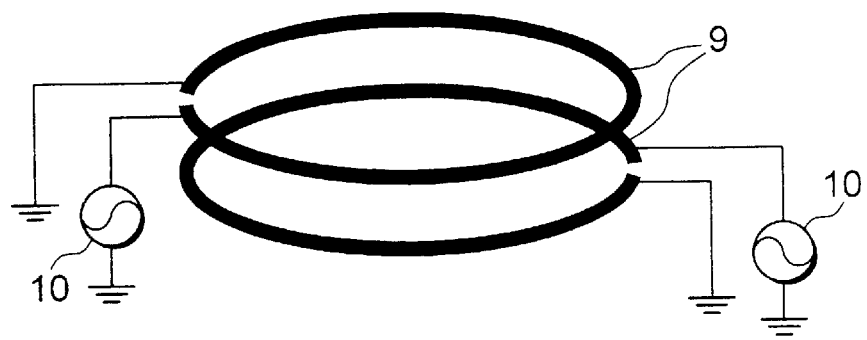
FIG. 6 is a view showing the relative layout of two one-turn antenna coils in the inductively coupled RF plasma source in FIG. 5.
Figure 7:
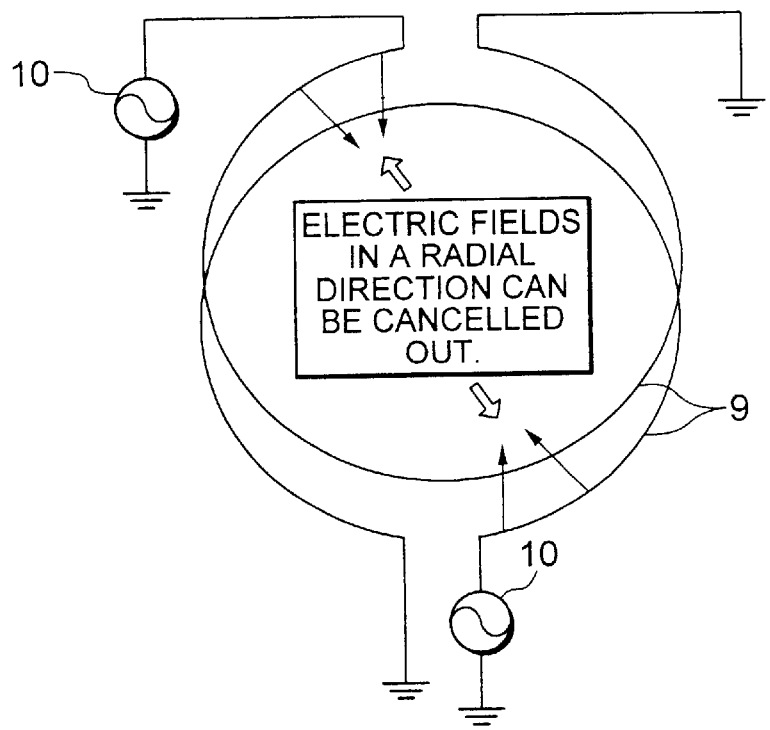
FIG. 7 is an illustration of the internal electric field generated by two one-turn antenna coils in the inductively coupled RF plasma source in FIG. 5.

These two antenna coils 9 are arranged alienated each other in the vertical direction with the introducing ends of these RF electric power arranged at an angular displacement of 180°, that is, the introducing ends of the RF electric power of both antenna coils 9 are arranged opposite to each other on the diameter as shown in FIG. 6. By arranging the antenna coils in this way, the radial electric field generated between the plasma and the antenna coil can be cancelled out as shown in FIG. 7 with the frequency of the RF power supply 10 held to 12.5 MHz, and with this contrivance, the non-uniformity at the time of wafer processing can be improved.

To the top end of the plasma generating chamber 8, a top plate 11 is arranged. On this top plate 11, for example, a target for sputtering may be mounted in accord with the application of plasma treatment, and in such case, the circuit can be configured to supply direct current or RF electric power.

Figure 1:
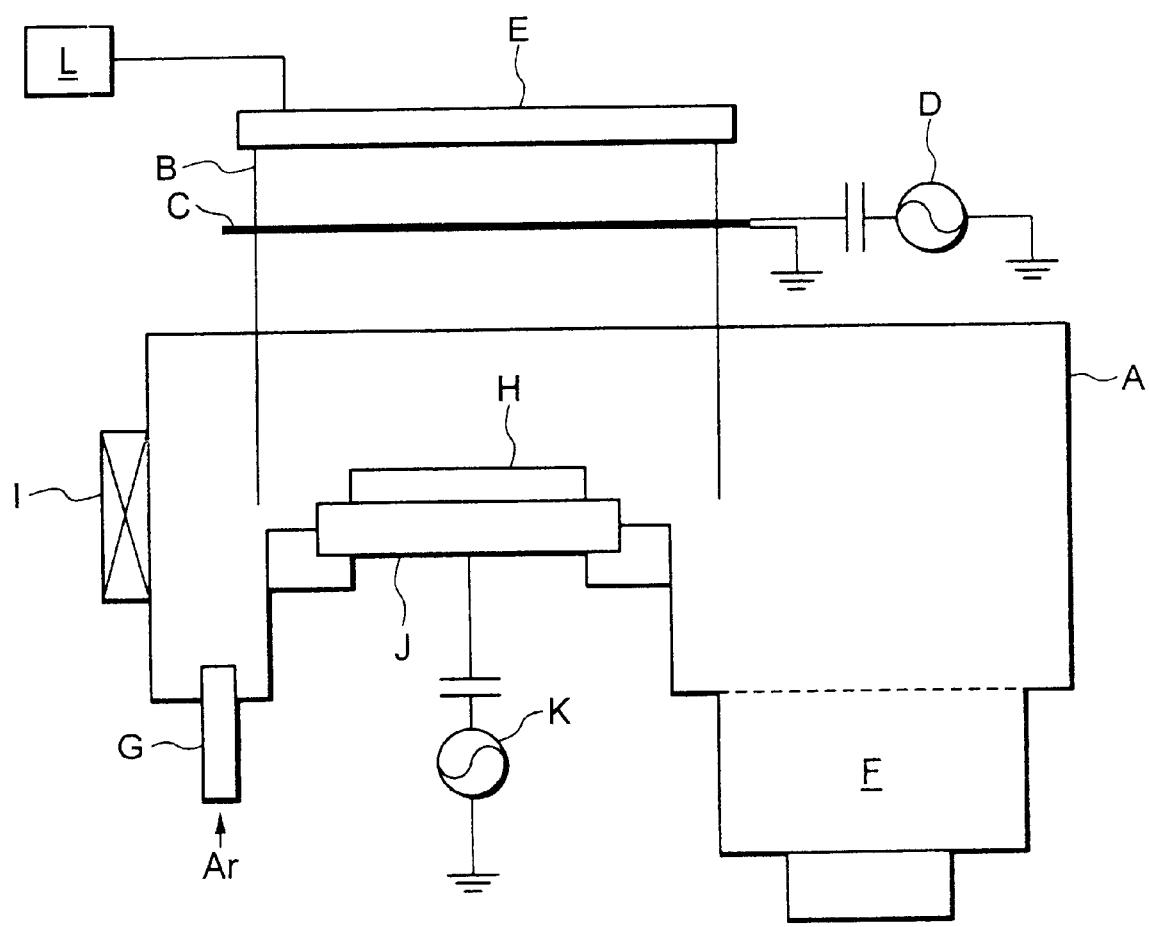
FIG. 1 is a schematic illustration showing a plasma treatment apparatus utilizing the inductively coupled RF plasma source equipped with a conventional one-turn antenna coil.
Figure 2:
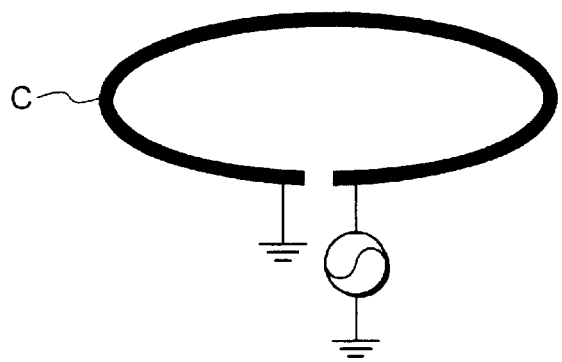
FIG. 2 shows the one-turn antenna coil shown in FIG. 1.
Figure 3:
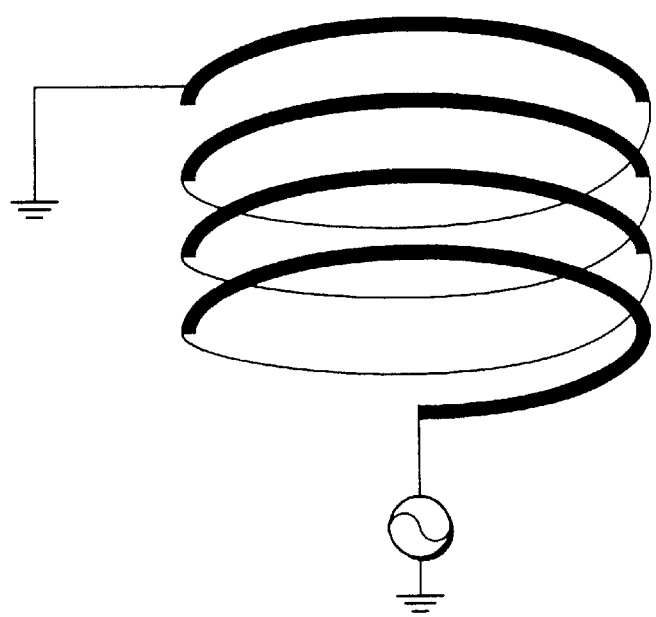
FIG. 3 shows a conventional multiple-turn antenna coil.
Figure 4:
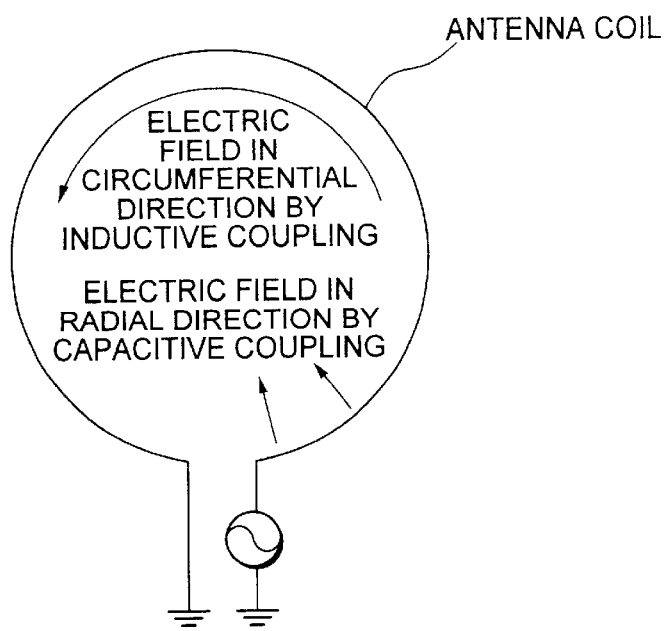
FIG. 4 shows the internal electric field generated by the conventional one-turn antenna coil.

Comparison experiments of wafer etching process were carried out by the use of the illustrated apparatus configured in this way and the conventional apparatus shown in FIG. 1.

Figure 8:
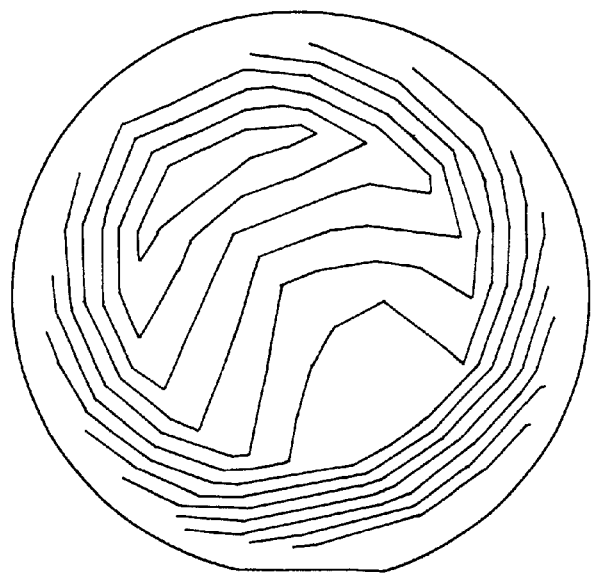
FIG. 8 shows a measuring example of etching treatment using the inductively coupled RF plasma source equipped with a conventional one-turn antenna coil.

First of all, in the conventional apparatus of FIG. 1, a wafer having a thermal oxide film is placed on the wafer holder, and 10 sccm of Ar gas is introduced. When a pressure reaches 0.1 Pa, 950 W/12.5 MHz of RF electric power is applied to the antenna coil, and to the wafer holder, 950 W/13.56 MHz of RF electric power is applied to the wafer holder. The thickness of thermal oxide film was measured before and after the treatment, and with the difference in thickness used as the etching depth, evaluations were carried out. As a result, as shown in FIG. 8, it is found that shift is generated in distribution of etching depth across the wafer surface.

Figure 9:
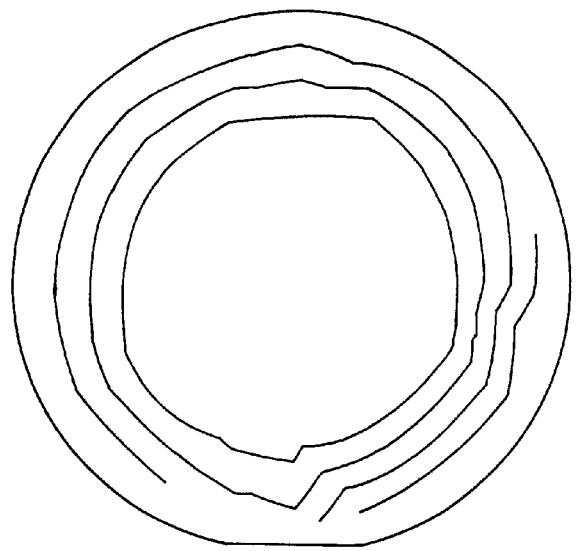
FIG. 9 shows the measuring example of etching process using the inductively coupled RF plasma source according to the present invention shown in FIG. 5.

On the other hand, the same experiment was carried out with the apparatus utilizing the inductively coupled RF plasma source according to the present invention as shown in FIG. 5. In this case, one RF power supply was used for the two antenna coils and the output was branched. The output was 950 W, which is the same as that used in the above-mentioned experiment, and other parameters as well were the same values. As a result, the shift was improved as shown in FIG. 9.

Figure 10:
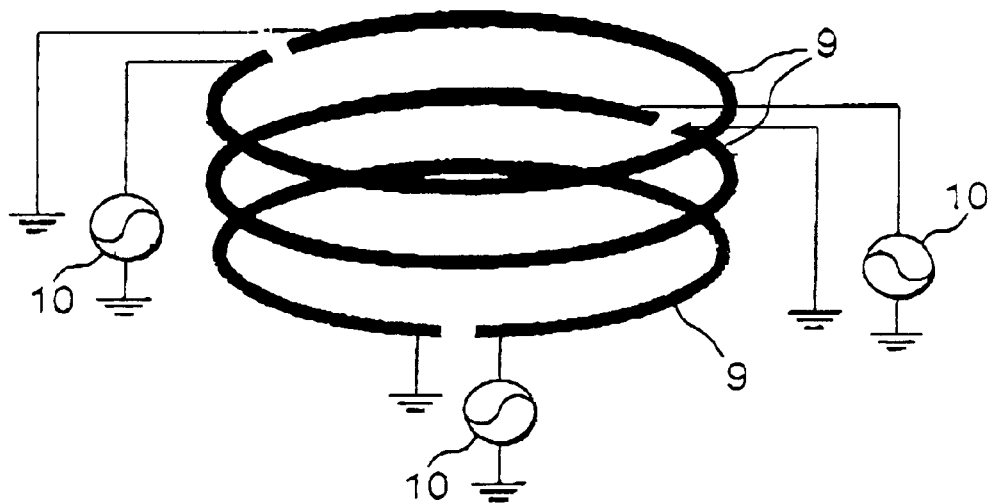
FIG. 10 is a view showing the relative layout of three one-turn antenna coils which may be used for the plasma source according to the present invention.
Figure 11:
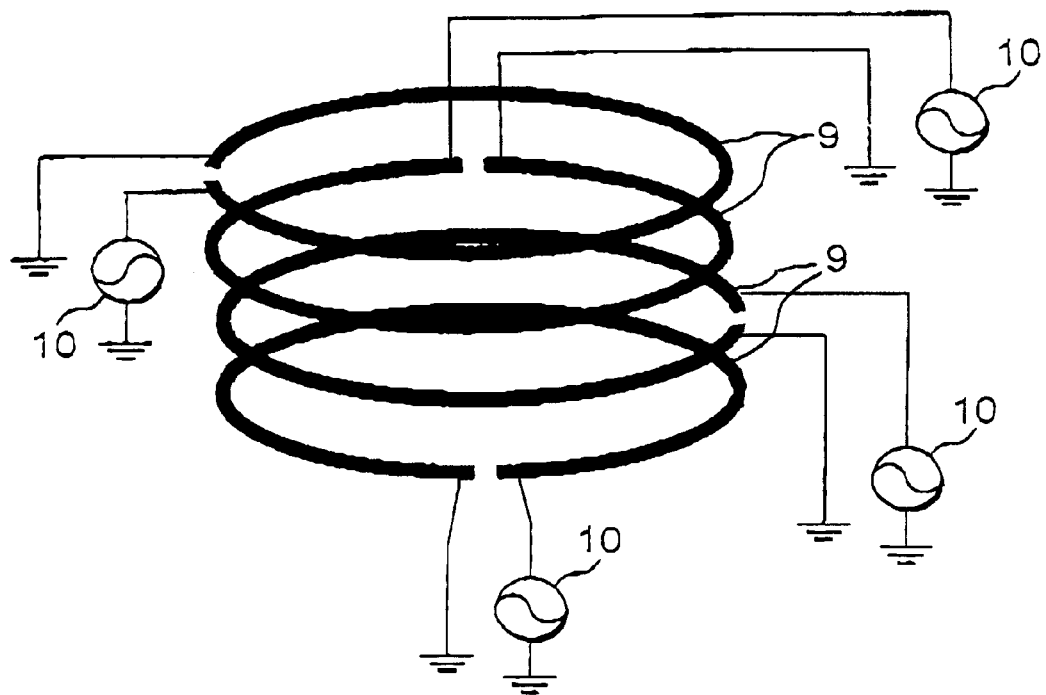
FIG. 11 is a view showing the relative layout of four one-turn antenna coils which may be used for the plasma source according to the present invention.
Figure 12:
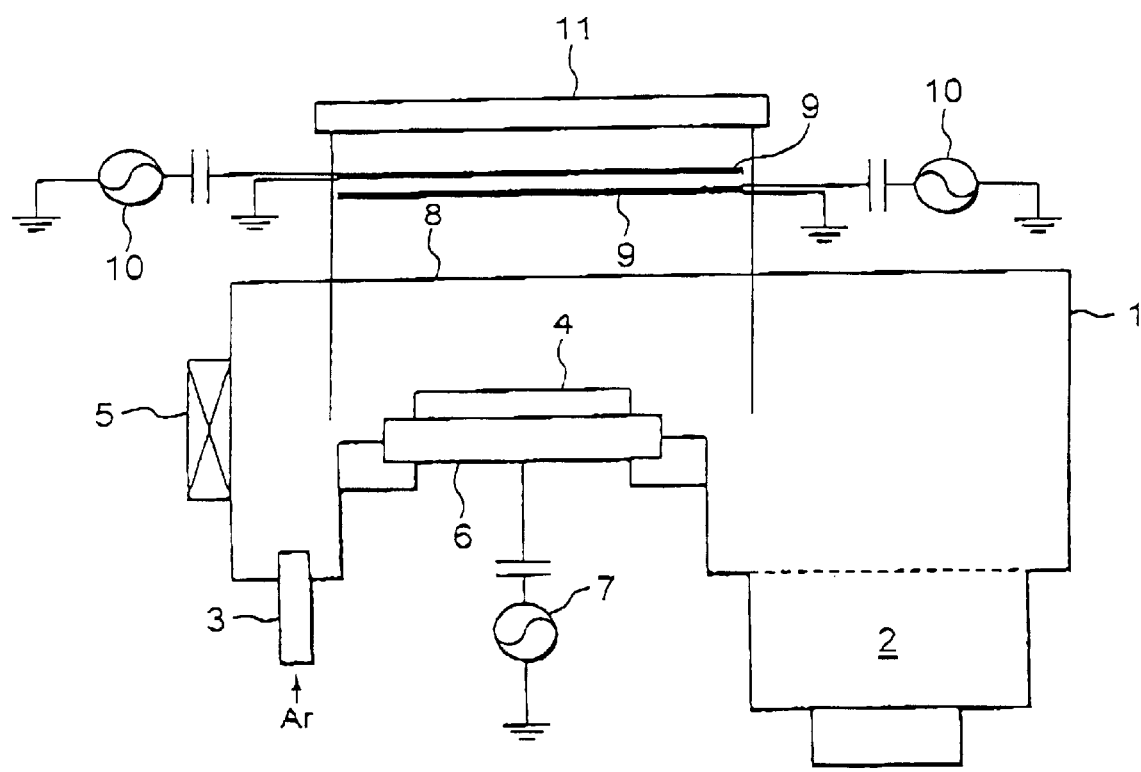
FIG. 12 is a schematic diagram showing a modification of the plasma source according to the present invention.

Now, in the embodiment illustrated, two one-turn antenna coils are used, but needless to say, two or more one-turn antenna coils may be provided, and in such case, each of those antenna coils is positioned so that their RF electric power introducing terminals are arranged at intervals of equal angle from each other. For example, in the case of three, as shown in FIG. 10, one end connected to the RF power supply of each of these three one-turn antenna coils is arranged at an angular displacement of 120° from each other in the circumferential direction of the circumferential side wall of the plasma generating chamber, and furthermore, in the case of four, as shown in FIG. 11, one end connected to the RF power supply of each of these four one-turn antenna coils is arranged at an angular displacement of 90° from each other in the circumferential direction of the circumferential side wall of the plasma generating chamber. As shown in FIG. 12 each of the one-turn antenna coils may be arranged along the inside of the circumferential side wall of the plasma generating chamber.

These one-turn antenna coils may be connected to their respective RF power supply or to a RF power supply in common to all the coils.

As described above, in the inductively coupled RF plasma source according to the present invention, by arranging a plurality of one-turn antenna coil with one end (first end) connected to the RF power supply along the circumferential side wall of the plasma generating chamber and the other end (second end) connected to the grounding potential at intervals in the longitudinal axial direction of the plasma generating chamber, and displacing one end (first end) of each one-turn antenna coil at equal angles from each other in the circumferential direction, the radial electric fields between the antenna coils and the plasma is made uniform, and the uniformity of wafer processing can be improved.

In addition, because the inductively coupled RF plasma source according to the present invention has coils connected in parallel when antenna coils are configured to be driven by one RF power supply, the reactor becomes one half of that when a one-turn antenna coil is used, and the electric power consumed in the coil can be reduced, and consequently, since the energy given to the plasma increases, the plasma density inside the chamber increases, and therefore, effects of increased plasma treatment speed, for example, etching speed, are able to be obtained.

What is claimed is:

1. An inductively coupled RF plasma source for generating a RF plasma using an inductive coupling comprising: a plurality of one-turn antenna coils, each having a first end connected to a RF power supply along a circumferential side wall of a plasma generating chamber and a second end connected to a grounding potential, said coils being arranged at intervals in the longitudinal axial direction of the plasma generating chamber, and one end of each one-turn antenna coil being displaced at equal angles from a corresponding end of each other one-turn antenna coil in a circumferential direction.

2. The inductively coupled RF plasma source of claim 1, wherein the circumferential side wall of the plasma generating chamber is composed of an electromagnetic wave-transmission type material and each of one-turn antenna coils is arranged along the outside of the circumferential side wall of the plasma generating chamber.

3. The inductively coupled RF plasma source of claim 1, wherein each of one-turn antenna coils is arranged along the inside of the circumferential side wall of the plasma generating chamber.

4. The inductively coupled RF plasma supply of claim 1, wherein the number of one-turn antenna coils is two, and first end connected to the RF power supply of each of these two one-turn antenna coils is arranged at an angular displacement of 180° from each other in the circumferential direction of the circumferential side wall of the plasma generating chamber.

5. The inductively coupled RF plasma source of claim 1, wherein the number of one-turn antenna coils is three, and first end connected to the RF power source of each of these three one-turn antenna coils is arranged at an angular displacement of 120° from each other in the circumferential direction of the circumferential side wall of the plasma generating chamber.

6. The inductively coupled RF plasma source of claim 1, wherein the number of one-turn antenna coils is four, and one end connected to the RF power source of each of these four one-turn antenna coils is arranged at an angular displacement of 90° from each other in the circumferential direction of the circumferential side wall of the plasma generating chamber.

7. The inductively coupled RF plasma source of claim 1, wherein the RF power supply connected to one end of each of the one-turn antenna coils is provided in common to all antenna coils.

8. The inductively coupled RF plasma source of claim 1, wherein the RF power supply connected to one end of each of the one-turn antenna coils is provided for each antenna coil.

9. The inductively-coupled RF plasma source of claim 1, wherein the inductively-coupled RF plasma source forms the parts of a sputtering system, plasma chemical vapor deposition system, or etching system.

10. A vacuum treatment system for treating a substrate comprising:

an inductively coupled RF plasma source for generating a RF plasma using an inductive coupling, said RF plasma source comprising a plurality of one-turn antenna coils, each having a first end connected to a RF power supply along a circumferential side wall of a plasma generating chamber and a second end connected to a grounding potential, said coils being arranged at intervals in the longitudinal axial direction of the plasma generating chamber, one end of each one-turn antenna coil being displaced at equal angles from a corresponding end of each other one-turn antenna coil in a circumferential direction.

11. The vacuum treatment system of claim 10, wherein the vacuum treatment system includes a sputtering system, chemical vapor deposition system, or etching system.

* * * * *